(12) United States Patent
Boerstler et al.

(10) Patent No.: US 6,958,636 B2
(45) Date of Patent: Oct. 25, 2005

(54) CHARGE LEAKAGE CORRECTION CIRCUIT FOR APPLICATIONS IN PLLS

(75) Inventors: David William Boerstler, Round Rock, TX (US); Franklin Manuel Baez, Ithaca, NY (US); Eskinder Hailu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 8 days.

(21) Appl. No.: 10/759,942

(22) Filed: Jan. 16, 2004

(65) Prior Publication Data

US 2005/0156640 A1 Jul. 21, 2005

(51) Int. Cl.[7] .............................................. H03K 5/13
(52) U.S. Cl. ...................... 327/156; 327/157; 327/159
(58) Field of Search ................................ 327/156, 157, 327/159, 141; 331/17, 25, 175

(56) References Cited

U.S. PATENT DOCUMENTS

| | | | | |
|---|---|---|---|---|
| 5,659,588 A | * | 8/1997 | Fiedler | 375/376 |
| 5,663,890 A | * | 9/1997 | Saleh et al. | 703/4 |
| 5,781,048 A | * | 7/1998 | Nakao et al. | 327/157 |
| 6,329,872 B1 | * | 12/2001 | Foroudi | 327/541 |
| 6,567,773 B1 | * | 5/2003 | Rahmat et al. | 703/14 |
| 6,573,770 B1 | * | 6/2003 | Gauthier et al. | 327/156 |
| 6,593,817 B1 | * | 7/2003 | Magazz' et al. | 331/17 |
| 6,611,161 B1 | * | 8/2003 | Kumar et al. | 327/157 |

* cited by examiner

*Primary Examiner*—Timothy P. Callahan
*Assistant Examiner*—An T. Luu
(74) *Attorney, Agent, or Firm*—Carr LLP; Diana R. Gerhardt

(57) ABSTRACT

An apparatus, a method, and a computer program are provided for correcting charge in a Phased Lock Loop (PLL). Typically, PLL's utilize a Low Pass Filter (LPF). However, as a result of improvement of Complimentary Metal-Oxide on a Semiconductor (CMOS) technology charge leakage has become prevalent within LPFs. As a result, the method, apparatus, and computer program provide a device and/or methodology for correcting for charge leakage.

17 Claims, 3 Drawing Sheets

CHARGE LEAKAGE CORRECTION CIRCUIT FOR APPLICATIONS IN PLLS

BACKGROUND OF THE INVENTION

1. Field of the Invention

The present invention relates generally to Phased Locked Loops (PLLs) and, more particularly, to charge correction for a PLL filter.

2. Description of the Related Art

Phased Locked Loops (PLLs) are common components utilized in a variety of applications. For example, Frequency Modulation (FM) and Amplitude Modulation (AM) modulators utilize PLLs. PLLs operate by locking onto a phase and frequency of an input signal through continual adjustment of an oscillator. The PLL oscillator can be current or voltage driven. Typically, though, the PLL oscillator is a Voltage Controlled Oscillator (VCO).

Referring to FIG. 1 of the drawings, the reference numeral 100 generally designates a conventional PLL. A conventional PLL comprises a Phase-Frequency Detector (PFD) 102, a charge pump 104, a Low Pass Filter (LPF) 106, a VCO 108, and a frequency divider 110.

The illustration of the components of the PLL, though, do not necessarily lend to a complete explanation. The LPF 106 further comprises a capacitor 116 and a resistor 118 which operated on the principle of capacitive impedance where impedance of a capacitor is inversely proportional to the signal frequency. Also, the charge pump 104 further comprises a first current source 105, a second current source 107, a first switch 112, and a second switch 114.

The PLL operates by maintaining charge on the first capacitor 116 of the LPF 106. A reference signal or input signal is input into the PFD 102 through a first node 122 along with feedback from the frequency divider 110 through a second node 132. Based on the comparison between the inputted signals, the PFD 102 either activates the first switch 112 of the charge pump 104 through a third node 124 or activates the second switch 114 of the charge pump 104 through a fourth node 126. By activating the first switch 112, the charge is added to the capacitor 116 of the LPF 106 through a fifth node 128. By activating the second switch 114, charge is removed from the capacitor 116 of the LPF 106 through the fifth node 128.

The active pulling down and pulling up the charge of the capacitor effectively changes the voltage of the LPF 106. The voltage of the LPF 106 is then used to control the voltage of the frequency and phase of the VCO 108. The voltage of the LPF 106 is maintained at the fifth node 128, which is input into the VCO 108. The VCO 108 then outputs an output signal through a sixth node 130 that has its phase and frequency synchronized with the input signal. The output signal from the VCO 108 is input into the frequency divider 110. Also, the output signal of VCO 108 is used in a variety of circuits to perform a variety of tasks.

With a conventional PLL 100 of FIG. 1, though, there are some disadvantages. Due to the advancement of Complimentary Metal-Oxide on a Semiconductor (CMOS) technology, the resulting thickness of the dielectric of the capacitor 116 of FIG. 1 has become increasingly smaller. As a result of decreasing thickness of the dielectric, there has been an increase in the leakage current across the capacitor 116 of FIG. 1. The PLL, then cannot maintain, the proper voltage for the VCO 108 of FIG. 1 resulting in drift of the locked in phase and frequency.

Therefore, there is a need for a method and/or apparatus for correction of leakage voltage in a PLL that addresses at least some of the problems associated with conventional methods and apparatuses for PLLs.

SUMMARY OF THE INVENTION

The present invention provides an apparatus for correcting charge leakage across an LPF. A voltage controlled Phased Locked Loop (PLL) is provided, wherein the PLL is at least configured to have a Low Pass Filter (LPF) and a Voltage Controlled Oscillator coupled at a first node. Also, a charge leakage correction circuit is provided that is at least coupled to the first node.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electromagnetic signaling techniques, and the like, have been omitted inasmuch as such details are not considered necessary to obtain a complete understanding of the present invention, and are considered to be within the understanding of persons of ordinary skill in the relevant art.

It is further noted that, unless indicated otherwise, all functions described herein may be performed in either hardware or software, or some combinations thereof. In a preferred embodiment, however, the functions are performed by a processor such as a computer or an electronic data processor in accordance with code such as computer program code, software, and/or integrated circuits that are coded to perform such functions, unless indicated otherwise.

Figure 2:
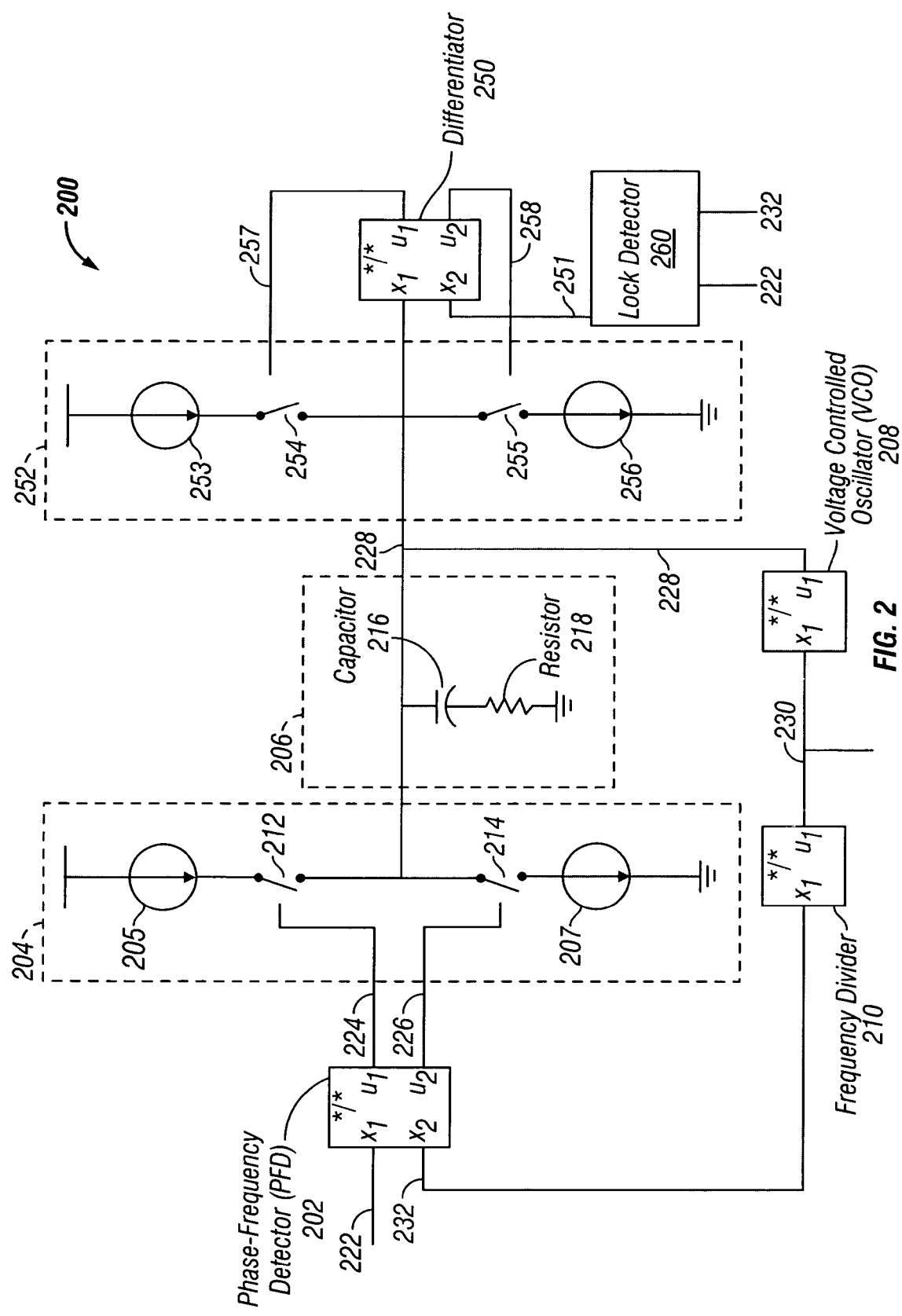
FIG. 2 is a block diagram depicting an improved PLL with a charge leakage correction circuit.

Referring to FIG. 2 of the drawings, the reference numeral 200 generally designates an improved PLL with current leakage correction circuit. The improved PLL comprises a PFD 202, a first charge pump 204, an LPF 206, a second charge pump 252, a differentiator 250, a VCO 208, and a frequency divider 210.

The illustration of the most basic components of the improved PLL, though, do not necessarily lend to a complete explanation. The LPF 206 further comprises a capacitor 216 and a resistor 218 which operated on the principle of capacitive impedance where impedance of a capacitor is inversely proportional to the signal frequency. Also, the first charge pump 204 further comprises a first current source 205, a second current source 207, a first switch 212, and a second switch 214. The second charge pump 252 further comprises a third current source 253, a fourth current source 256, a third switch 254, and a fourth switch 255.

Figure 1:
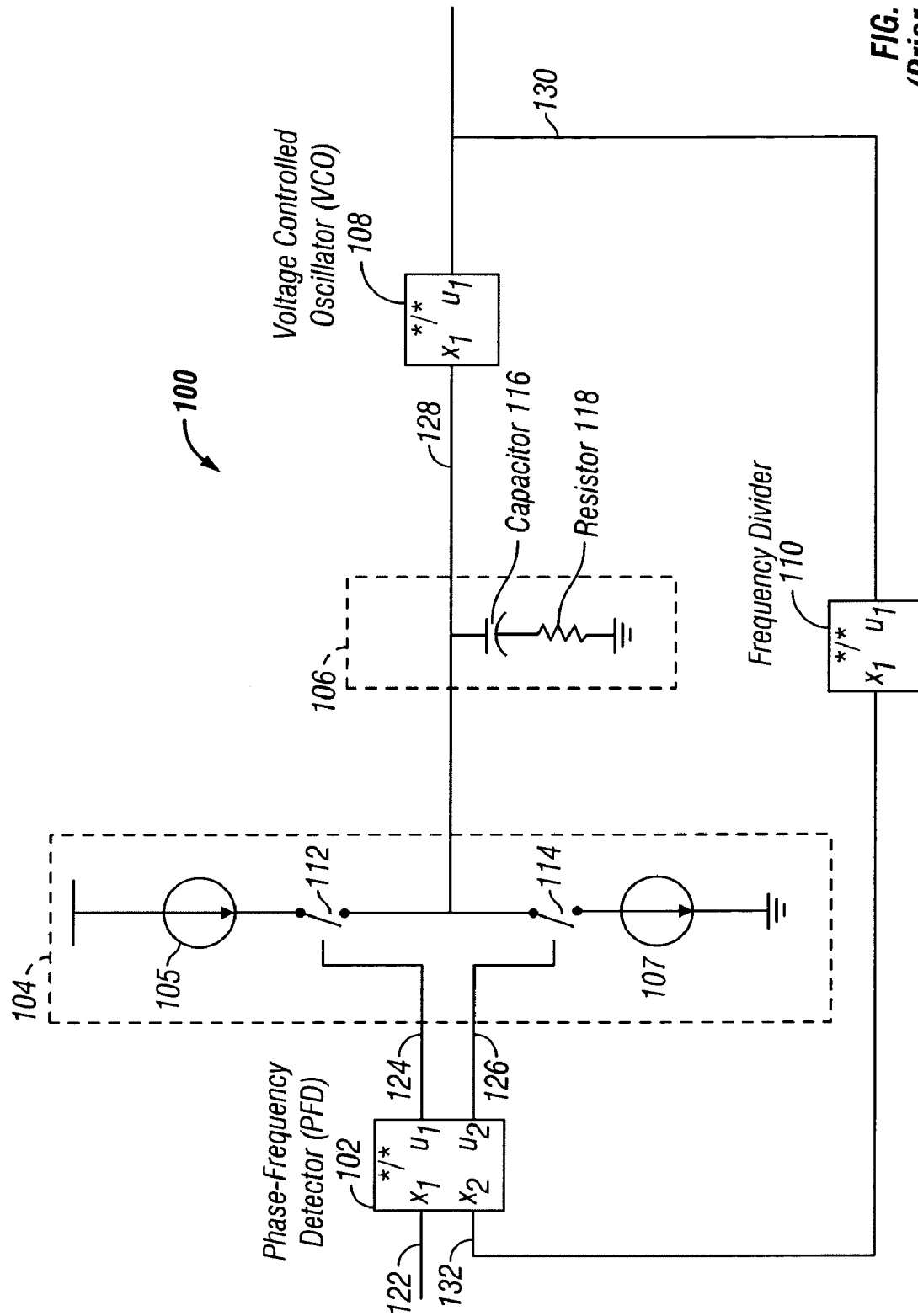
FIG. 1 is a block diagram depicting a conventional PLL.

In a conventional PLL as depicted in FIG. 1, though, maintaining a constant "locked" voltage can be difficult because of technological changes. Due to better and better CMOS technology, the thickness of the capacitor dielectric (not shown) has decreased. As a result, current leakage across the dielectric (not shown) becomes problematic because the voltage across the capacitor 116 of FIG. 1 fluctuates. These fluctuations translate into severe short-term jitter in the output characteristic of the VCO 108. The addition of correction circuitry (the second charge pump 252 of FIG. 2 and a differentiator 250 of FIG. 2) reduces the fluctuations resulting in a clean signal.

The improved PLL operates by maintaining charge on the capacitor 216 of the LPF 206. A reference signal or input signal is input into the PFD 202 through a first node 222 along with feedback from the frequency divider 210 through a second node 232. Based on the comparison between the inputted signals, the PFD 202 either activates the first switch 212 of the first charge pump 204 through a third node 224 or activates the second switch 214 of the first charge pump 204 through a fourth node 226. By activating the first switch 212, the charge is added to the capacitor 216 of the LPF 206 through a fifth node 228. By activating the second switch 214, charge is removed from the capacitor 216 of the LPF 206 through the fifth node 228.

The active pulling down and pulling up the charge of the capacitor effectively changes the voltage of the LPF 206. The voltage of the LPF 206 is then used to control the voltage of the frequency and phase of the VCO 208. The voltage of the LPF 206 is maintained at the fifth node 228 which is input into the VCO 208. The VCO 208 then outputs an output signal through a sixth node 230 that has a phase and frequency that is synchronized with the input signal. The output signal from the VCO 208 is input into the frequency divider 210. Also, the output signal of VCO 208 is used in a variety of circuits to perform a variety of tasks.

However, also attached to the fifth node 228, is a second charge pump 252 and differentiator 250. While the PFD 202, first charge pump 204, and LPF 206 are in the process of achieving phase and frequency lock, the differentiator 250 remains off. Thus, initially, the second charge pump 252 and the differentiator 250 are inactive. A lock detector 260 monitors the voltages of the first node 222 and the second node 232 to determine if phase and frequency lock have been achieved. Once lock is achieved, the differentiator 250 is enabled through the lock detection node 251. The differentiator 250 then monitors the voltage at the fifth node 228.

In the process of monitoring the voltage at the fifth node 228, the differentiator can determine the rate of change of the voltage at the fifth node 228 with respect to time or effectively determine the derivative of the voltage (dV/dt). The derivative of the voltage (dV/dt) is proportional to the leakage current through the capacitor 216 of the LPF 206. If the rate of change of the voltage is greater than zero (dV/dt>0), then the voltage on the fifth node 228 is too high, and the fourth switch 255 of the second charge pump 252 is engaged. When the fourth switch 255 is engaged, the fourth current source 256 draws current from the fifth node 228 to lower the voltage to the proper level. If the rate of change of the voltage is less than zero (dV/dt<0), then the voltage on the fifth node 228 is too low, and the third switch 254 of the second charge pump 252 is engaged. When the third switch 254 is engaged, the third current source 253 supplies current to the fifth node 228 to increase the voltage to the proper level. Also, when the rate of change of the voltage is zero (dV/dt=0), then the third switch 254 and the fourth switch 255 are disengaged.

Figure 3A:
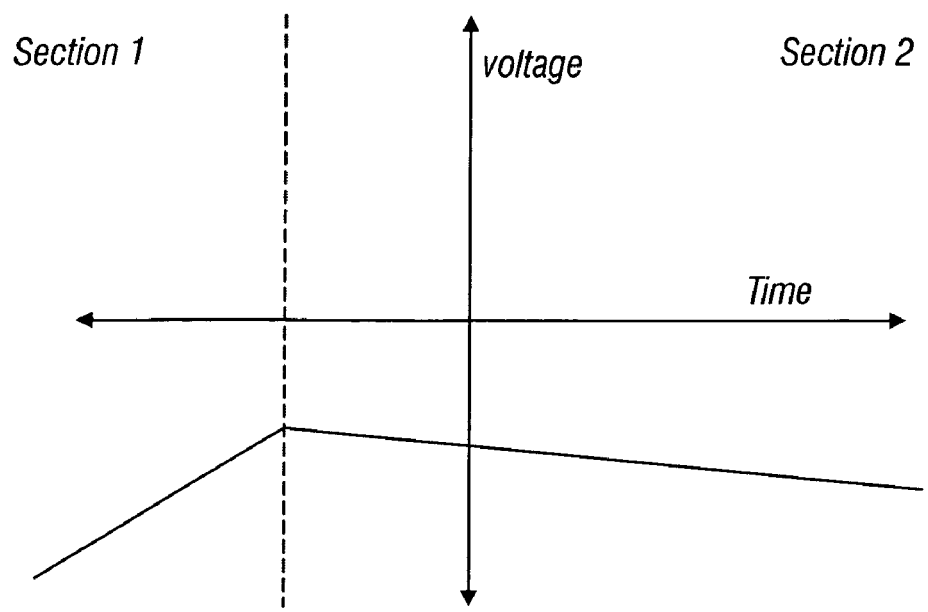
FIGS. 3a and 3b are graphs depicting the comparative operations of a PLL with and without current leakage correction.
Figure 3B:
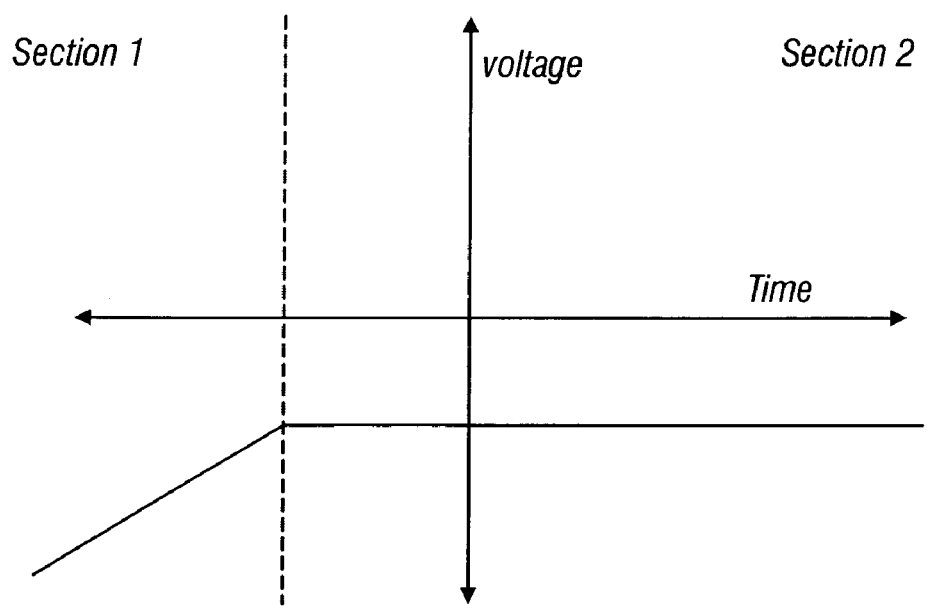

Referring to FIGS. 3a and 3b of the drawings, the reference numeral 300 generally designates graphs depicting the comparative operations of a PLL with and without current leakage correction. Both FIGS. 3a and 3b voltages versus time graphs at node 228 of FIG. 2.

In section 1 of FIGS. 3a and 3b, the first charge pump 204 of FIG. 2 is on and the second charge pump 252 of FIG. 2 is off. During this phase of operation, the PFD 202 and the first charge pump 204 of FIG. 2 are actively seeking phase and frequency lock. The PFD 202 of FIG. 2 actively engages the first switch 212 and second switch 214 of the first charge pump 204 of FIG. 2 to achieve the proper voltage at the capacitor 216 of the LPF 206 of FIG. 2.

In section 2 of FIG. 3a, when lock is achieved the first charge pump 204 of FIG. 2 is off. Also, the second charge pump 252 of FIG. 2 is off for the purposes of illustration. After phase and frequency lock have been achieved, the voltage, in section 2 of FIG. 3a, is not constant. This is due to the leakage current associated with the capacitor 216 of FIG. 2.

In section 2 of FIG. 3b, when phase and frequency lock are achieved, the first charge pump 204 of FIG. 2 is off and the second charge pump 252 of FIG. 2 is on. The second charge pump 252 of FIG. 2 actively corrects voltage fluctuations across the LPF 206 of FIG. 2 to maintain a constant voltage. Therefore, after phase and frequency lock have been achieved, the voltage, in section 2 of FIG. 3b, is constant.

It will further be understood from the foregoing description that various modifications and changes may be made in the preferred embodiment of the present invention without departing from its true spirit. This description is intended for purposes of illustration only and should not be construed in a limiting sense. The scope of this invention should be limited only by the language of the following claims.

What is claimed is:

1. An apparatus for phase and frequency locking, comprising:
   a voltage controlled Phased Locked Loop (PLL), wherein the PLL is at least configured to have a Low Pass Filter (LPF) and a Voltage Controlled Oscillator coupled at a first node; and
   a charge leakage correction circuit coupled to the first node that is at least configured to:
   measure a first voltage across the LPF at lock;
   measure a second voltage across the LPF periodically after lock;
   add charge to the LPF if the rate of chance of voltage across the LPF is negative; and
   subtract charge from the LPF if the rate of change is positive.

2. The apparatus of claim 1, wherein the charge leakage correction circuit further comprises:
   a charge pump, wherein the charge pump is at least configured to add charge to the LPF and wherein the charge pump is at least configured to subtract voltage from the LPF; and
   a differentiator, wherein the differentiator is at least coupled to the charge pump and wherein the differentiator is at least configured to measure the rate of change of the voltage across the LPF.

3. The apparatus of claim 1, wherein the apparatus is a processor.

4. The apparatus of claim 1, wherein the apparatus is a computer.

5. An apparatus for phase and frequency locking, comprising:

a voltage controlled Phased Locked Loop (PLL), wherein the PLL is at least configured to have a Low Pass Filter (LPF) and a Voltage Controlled Oscillator coupled at a first node; and a charge leakage correction circuit at least coupled to the first node, wherein the charge leakage correction circuit further comprises:

a differentiator, wherein the differentiator is at least coupled to a charge pump and the first node, and wherein the differentiator is at least configured to measure the rate of change of the voltage across the LPF by measuring a first voltage at lock and a second voltage periodically after lock;

the charge pump, wherein the charge pump is at least configured to add charge to the LPF if the rate of change is negative, and wherein the charge pump is at least configured to subtract charge from the LPF if the rate of change is positive.

6. The apparatus of claim 5, wherein the charge pump further comprises:

a plurality of switches at least configured to be coupled to the first node;

a positive current source coupled to at least one first switch of a plurality of switches; and a negative current source coupled to at least one second switch of a plurality of switches.

7. The apparatus of claim 5, wherein the apparatus is a processor.

8. The apparatus of claim 5, wherein the apparatus is a computer.

9. An apparatus for correcting charge leakage across an LPF coupled to a first node, comprising:

a differentiator coupled to a charge pump and the first node wherein the differentiator is at least configured to measure the rate of change of the voltage across the LPF by measuring a first voltage at lock and a second voltage periodically after lock;

the charge pump coupled to the first node, wherein the charge pump is at least configured to add charge to the LPF if the rate of change is negative, and wherein the charge pump is at least configured to subtract charge from the LPF if the rate of change is positive.

10. The apparatus of claim 9, wherein the apparatus is a processor.

11. The apparatus of claim 9, wherein the apparatus is a computer.

12. A method for correcting charge in a PLL having an LPF, comprising:

locking a phase and a frequency;

measuring the rate of change for voltage across the LPF by measuring a first voltage at lock and a second voltage periodically after lock;

if the rate of change of voltage across the LPF is positive, removing charge from the LPF; and if the rate of change of voltage across the LPF is negative, adding charge to the LPF.

13. The method of claim 12, wherein the method is practiced by a computer system having at least one processor.

14. A method for correcting charge in a PLL having an LPF, comprising:

locking a phase and a frequency;

measuring the voltage across the LPF at lock to obtain a first measured voltage;

measuring the voltage across the LPF periodically after lock to obtain a second measured voltage;

if difference between the second measured voltage and the first measured voltage is positive, removing charge from the LPF;

if difference between the second measured voltage and the first measured voltage is negative, adding charge to the LPF.

15. The method of claim 14, wherein the method is practiced by a computer system having at least one processor.

16. A computer program product for correcting charge in a PLL having an LPF, the computer program having a medium with a computer program embodied thereon, the computer program comprising:

computer program code for locking a phase and a frequency;

computer program code for measuring the rate of change for voltage across the LPF by measuring a first voltage at lock and a second voltage periodically after lock;

if the rate of change of voltage across the LPF is positive, computer program code for removing charge from the LPF; and if the rate of change of voltage across the LPF is negative, computer program code for adding charge to the LPF.

17. A computer program product for correcting charge in a PLL having an LPF, the computer program having a medium with a computer program embodied thereon, the computer program comprising:

computer program code for locking a phase and a frequency;

computer program code for measuring the voltage across the LPF at lock to obtain a first measured voltage;

computer program code for measuring the voltage across the LPF periodically after lock to obtain a second measured voltage;

if difference between the second measured voltage and the first measured voltage is positive, computer program code for removing charge from the LPF;

if difference between the second measured voltage and the first measured voltage is negative, computer program code for adding charge to the LPF.

* * * * *

UNITED STATES PATENT AND TRADEMARK OFFICE
CERTIFICATE OF CORRECTION

PATENT NO. : 6,958,636 B2 Page 1 of 1
DATED : October 25, 2005
INVENTOR(S) : Boerstler et al.

It is certified that error appears in the above-identified patent and that said Letters Patent is hereby corrected as shown below:

<u>Column 4,</u>
Line 48, delete "chance" and insert -- change --.

Signed and Sealed this

Third Day of January, 2006

JON W. DUDAS
*Director of the United States Patent and Trademark Office*